US011153969B2

(12) United States Patent
Lin

(10) Patent No.: US 11,153,969 B2
(45) Date of Patent: Oct. 19, 2021

(54) FLEXIBLE DISPLAY PANELS AND DISPLAY DEVICES

(71) Applicant: Yungu (Gu'an) Technology Co., Ltd., Hebei (CN)

(72) Inventor: Li Lin, Kunshan (CN)

(73) Assignee: Yungu (Gu'an) Technology Co., Ltd., Langfang (CN)

(*) Notice: Subject to any disclaimer, the term of this patent is extended or adjusted under 35 U.S.C. 154(b) by 0 days.

(21) Appl. No.: 16/961,825

(22) PCT Filed: Jun. 25, 2019

(86) PCT No.: PCT/CN2019/092844
§ 371 (c)(1),
(2) Date: Jul. 13, 2020

(87) PCT Pub. No.: WO2020/107881
PCT Pub. Date: Jun. 4, 2020

(65) Prior Publication Data
US 2021/0092834 A1 Mar. 25, 2021

(30) Foreign Application Priority Data

Nov. 26, 2018 (CN) .......................... 201811420006.9

(51) Int. Cl.
H05K 1/02 (2006.01)

(52) U.S. Cl.
CPC ........... *H05K 1/0296* (2013.01); *H05K 1/028* (2013.01); *H05K 2201/10128* (2013.01)

(58) Field of Classification Search
CPC ......... H05K 1/028; H05K 2201/10128; H05K 1/0296
(Continued)

(56) References Cited

U.S. PATENT DOCUMENTS

2014/0216790 A1* 8/2014 Trauernicht .......... G06F 3/0446
174/253
2016/0174304 A1* 6/2016 Kim .................... H01L 51/5253
313/511
(Continued)

FOREIGN PATENT DOCUMENTS

CN 105144270 A 12/2015
CN 106711172 A 5/2017
(Continued)

OTHER PUBLICATIONS

State Intellectual Property Office of the People's Republic of China, Office Action and Search Report Issued in Application No. 201811420006.9, dated Jul. 15, 2019, 20 pages, (Submitted with Machine Translation).

(Continued)

Primary Examiner — Sherman Ng
(74) Attorney, Agent, or Firm — Maier & Maier, PLLC

(57) ABSTRACT

A flexible display panel and a display device are provided. The flexible display panel includes a bent portion. The bent portion includes a substrate layer group and a conductive wire group. The conductive wire group is located on the substrate layer group. The conductive wire group includes a plurality of conductive wires in a curved shape. At least two of the plurality of conductive wires cross and surround at least one closed region. The at least one closed region is provided at least corresponding to a bent region of the bent portion.

18 Claims, 5 Drawing Sheets

(58) Field of Classification Search
USPC .......................................................... 361/749
See application file for complete search history.

(56) References Cited

U.S. PATENT DOCUMENTS

| | | | |
|---|---|---|---|
| 2016/0211210 A1 | 7/2016 | Seo et al. | |
| 2016/0254286 A1* | 9/2016 | Song | H01L 27/1218 257/91 |
| 2016/0285046 A1 | 9/2016 | Son et al. | |
| 2017/0301266 A1 | 10/2017 | Zhang et al. | |
| 2018/0182291 A1* | 6/2018 | Hanari | H01L 27/3276 |
| 2019/0165333 A1* | 5/2019 | Harada | H01L 27/3246 |

FOREIGN PATENT DOCUMENTS

| | | |
|---|---|---|
| CN | 107004767 A | 8/2017 |
| CN | 206758434 U | 12/2017 |
| CN | 207233319 U | 4/2018 |
| CN | 107977116 A | 5/2018 |
| CN | 108346682 A | 7/2018 |
| CN | 108389869 A | 8/2018 |
| CN | 108520893 A | 9/2018 |
| CN | 108766245 A | 11/2018 |
| CN | 109389906 A | 2/2019 |
| CN | 109449190 A | 3/2019 |

OTHER PUBLICATIONS

ISA State Intellectual Property Office of the People's Republic of China, International Search Report Issued in Application No. PCT/CN2019/092844, dated Sep. 27, 2019, WIPO, 4 pages.

* cited by examiner

FLEXIBLE DISPLAY PANELS AND DISPLAY DEVICES

CROSS-REFERENCE TO RELATED APPLICATIONS

This patent application is a national stage application of International Application No. PCT/CN2019/092844, filed on Jun. 25, 2019, which claims priority to Chinese Patent Application No. 2018114200069, filed on Nov. 26, 2018 and entitled "Flexible Display Panel And Display Device", both of which are incorporated herein by reference in their entireties.

FIELD

The present disclosure relates to the field of display technology, and particularly to a flexible display panel and a display device.

BACKGROUND

Currently, with the development of flexible display technology, edges of the flexible display panel may be bent to improve the aesthetics of the flexible display panel.

Based on the bendable flexible display panel, it is proposed to attach a chip component to a bent portion of the flexible display panel so as to avoid additional provision of a flexible printed circuit board and reduce the area of non-display regions at the edges of the flexible display panel. However, since the edges of the flexible display panel are bent, new requirements are placed on the bending performance of the flexible display panel.

SUMMARY

In order to improve the bending performance of the flexible display panel, the present disclosure provides a flexible display panel and a display device.

According to an example of the present disclosure, a flexible display panel is provided. The flexible display panel includes a bent portion. The bent portion includes a substrate layer group and a conductive wire group. The conductive wire group is located on the substrate layer group. The conductive wire group includes a plurality of conductive wires in a curved shape. At least two of the plurality of conductive wires cross and surround at least one closed region. The at least one closed region is provided at least corresponding to a bent region of the bent portion.

According to an example of the present disclosure, a display device is provided, including the display panel as described above.

In this disclosure, on one hand, a stress may be buffered by the curved conductive wires included in the conductive wire group, and on the other hand, the stress may be buffered by the closed region formed through the crossing of the conductive wires, such that the ability of the bent portion to buffer the stress is strengthened and the risk of breakage is reduced. Furthermore, because the conductive wires included in the conductive wire group are curved, compared with straight conductive wires, relief space may be provided, which is helpful to improve the compact arrangement of the conductive wire group on the bent portion.

BRIEF DESCRIPTION OF THE DRAWINGS

The accompanying drawings, which are incorporated in and constitute a part of this specification, illustrate examples consistent with the present disclosure and, together with the description, serve to explain the principles of the disclosure.

DETAILED DESCRIPTION OF THE EMBODIMENTS

Figure 1:
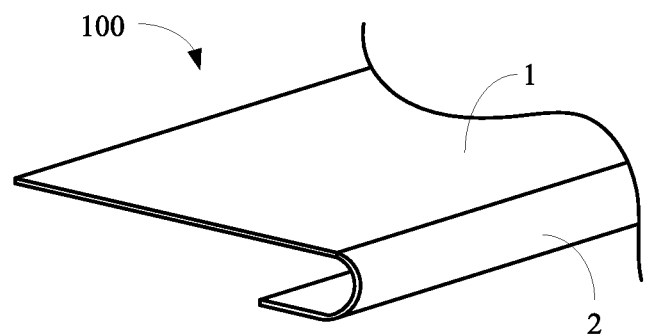
FIG. 1 is a schematic structural diagram illustrating a flexible display panel according to an example of the present disclosure.

Examples will be described in detail herein, with the illustrations thereof represented in the drawings. When the following descriptions involve the drawings, like numerals in different drawings refer to like or similar elements unless otherwise indicated. The embodiments described in the following examples do not represent all embodiments consistent with the present disclosure. Rather, they are merely examples of apparatuses and methods consistent with some aspects of the present disclosure as detailed in the appended claims.

FIG. 1 is a schematic structural diagram illustrating a flexible display panel 100 according to an example of the present disclosure. In FIG. 1, the flexible display panel 100 may include a flat portion 1 and a bent portion 2 connected with the flat portion 1. The bent portion 2 is bent from a connection between the flat portion 1 and the bent portion 2 and is formed by extending parallel to the flat portion 1. As such, a chip component (not shown in the figure) for controlling the flexible display panel 100 to display may be provided on a region of the bent portion 2 parallel to the flat portion 1, which, relative to a solution of providing the chip component on a flexible printed circuit board in the related art, may reduce a width of bent edges, lessen black border regions of the flexible display panel 100, and improve aesthetics.

Figure 2:
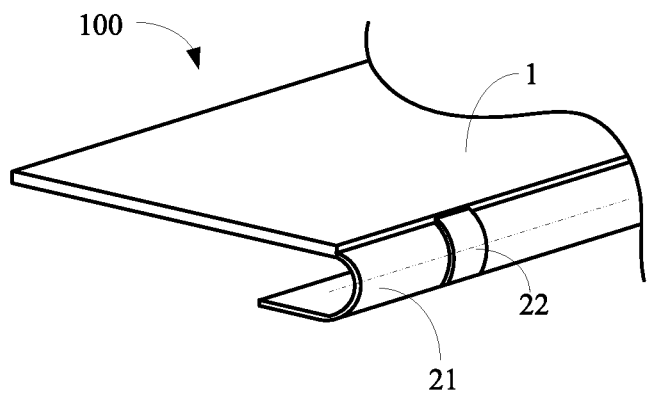
FIG. 2 is a schematic partial diagram illustrating a flexible display panel according to an example of the present disclosure.
Figure 3:
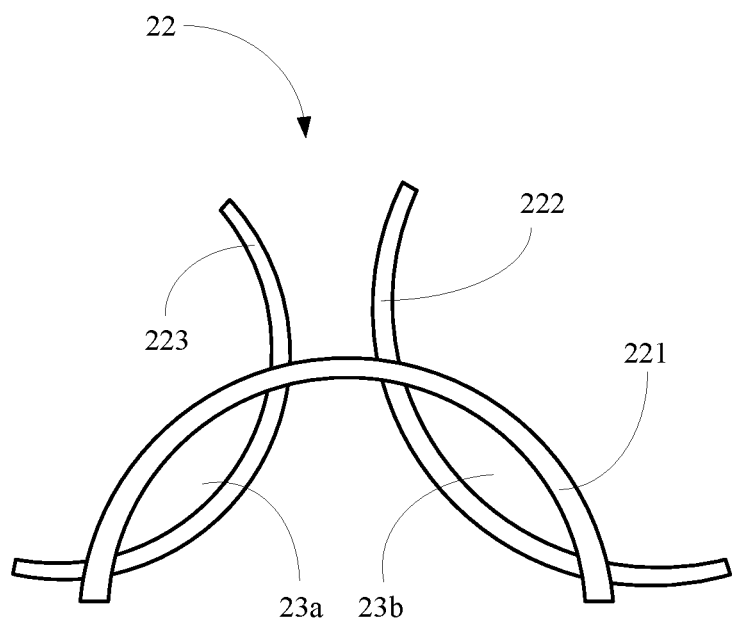
FIG. 3 is a schematic structural diagram illustrating a conductive wire group according to an example of the present disclosure.

A region corresponding to the flat portion 1 may be provided with a pixel structure, which is configured to a display region of the flexible display panel 100, and a chip component for controlling a switch state of the pixel structure is provided at the bent portion 2. In order to realize the electrical connection between the chip component and the pixel structure, as shown in FIGS. 2 and 3, the bent portion 2 may include a substrate layer group 21 and a conductive wire group 22 provided on the substrate layer group 21. The conductive wire group 22 may include a plurality of conductive wires in a curved shape, and one of the plurality of conductive wires crosses with at least one of other conductive wires to surround at least one closed region 23. The closed region 23 is provided at least corresponding to a bent region of the bent portion 2. As such, during the bending of the bent portion 2, a stress generated from bending may be buffered by the closed region 23 to improve the bending resistance of the conductive wire group 22.

For example, in FIG. 3, the conductive wire group 22 may include a first conductive wire 221, a second conductive wire 222, and a third conductive wire 223. The first conductive wire 221 crosses with the second conductive wire 222 to surround a closed region 23a, and the first conductive wire 221 crosses with the third conductive wire 223, to surround a closed region 23b. The closed regions 23a and 23b are provided corresponding to the bent region of the bent portion 2. Here the first conductive wire 221, the second conductive wire 222, and the third conductive wire 223 are taken as an example. In some other examples, there may be more conductive wires, which will not be described again. In addition, although the closed region 23 formed by a crossing way may have other arrangements, this disclosure does not limit thereto. Moreover, in FIG. 3, since the first conductive wire 221, the second conductive wire 222, and the third conductive wire 223 are provided in a curved shape, in addition to the closed region 23, the bending of respective conductive wires may also form a concave or convex region. The concave or convex region may also improve the bending performance of the conductive wire group 22, and reduce the risk of breakage of the flexible display panel 100 due to bending.

From the above examples, it can be known that in this disclosure, on one hand, a stress may be buffered by the curved conductive wires included in the conductive wire group 22, and on the other hand, the stress may be buffered by the closed region 23 formed through the crossing of the conductive wires, such that the ability of the bent portion 2 to buffer the stress is strengthened, and the risk of breakage is reduced. Furthermore, because the conductive wires included in the conductive wire group 22 are curved, compared with straight conductive wires, relief space may be provided, which is helpful to improve the compact arrangement of the conductive wire group 22 on the bent portion 2.

For the formation method of the conductive wire group 22, a plurality of conductive wires in a curved shape may be formed on a same layer, and any of the conductive wires is made to cross with at least one of other conductive wires to obtain the conductive wire group 22 provided in the present disclosure. Furthermore, cross-sectional areas of respective conductive wires in the conductive wire group 22 may be equal or different.

Figure 4:
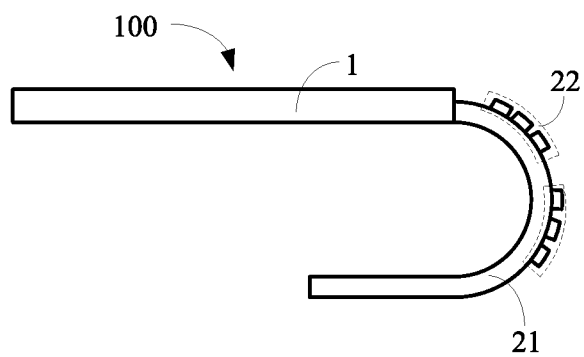
FIG. 4 is a schematic partial diagram illustrating another flexible display panel according to an example of the present disclosure, in which the length direction of the conductive wire group may be parallel to the bending axis of the bent portion.

The conductive wire group 22 may be located at any position of the bent portion 2 or be at any angle to a bending axis (as shown by a broken line in FIG. 2) of the bent portion 22. For example, in FIG. 2, a length direction of the conductive wire group 22 may be perpendicular to the bending axis of the bent portion 2, that is, the conductive wire group 22 may be bent around the bending axis. For another example, in FIG. 4, the length direction of the conductive wire group 22 may be parallel to the bending axis of the bent portion 2. In some other examples, it may also be at other angles to the bending axis, such as 30° and 60°, which is not limited in this disclosure.

In an example of the present disclosure, a size of the closed region 23 is related to a bending strength of the bent portion 2 and a conductivity of the conductive wire group 22. In an example, in a side-by-side direction (as shown by a double-headed arrow B in FIG. 5) of the plurality of conductive wires included in the conductive wire group 22, a ratio of a maximum width of the closed region 23 to a width of each conductive wire is in a range of 0.5-2. For example, the maximum width of the closed region 23 may be equal to a width of any conductive wire, or 0.8 and 1.5 times the width of any conductive wire.

Figure 5:
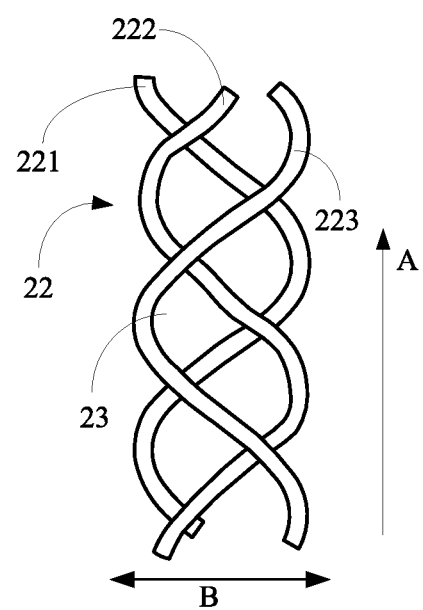
FIG. 5 is a schematic structural diagram illustrating another conductive wire group according to an example of the present disclosure, in which the plurality of conductive wires are provided in a wave shape along the length direction.

In this example, as shown in FIG. 5, length directions of the plurality of conductive wires included in the conductive wire group 22 are same, and the plurality of conductive wires are provided in a wave shape along the length direction. That is, as shown in FIG. 5, the first conductive wire 221, the second conductive wire 222 and the third conductive wire 223 are wavy in a direction indicated by an arrow A. As such, when two conductive wires cross, based on a shape of arrangement of the conductive wires and characteristics of length directions thereof, a plurality of closed regions 23 may be formed by crossing, thereby effectively enhancing the bending performance of the bent portion 2.

Furthermore, the conductive wire group 22 may include at least three conductive wires, and each of the conductive wires crosses with another conductive wire to form a plurality of closed regions side by side. Still as shown in FIG. 5, it is assumed that the conductive wire group 22 may include a first conductive wire 221, a second conductive wire 222 and a third conductive wire 223. The first conductive wire 221 and the second conductive wire 222 cross, the first conductive wire 221 and the third conductive wire 223 cross, and the second conductive wire 222 and the third conductive wire 223 cross, so that a first row of closed regions on a left side of the conductive wire group 22 and a second row of closed regions on a right side of the conductive wire group 22 are formed, thereby increasing the number of closed regions 23 and enhancing the bending performance.

In this example, in a side-by-side direction of the plurality of closed regions, two adjacent rows of closed regions are arranged in a staggered manner. As such, through the cooperation of a plurality of rows of closed regions, in the side-by-side direction of the conductive wires included in the conductive wire group 22, each position of the conductive wire group 22 has at least a part of the bent region, improving the bending performance at each position of the conductive wire group 22, and enhancing the overall bending performance of the flexible display panel 100.

A density of the closed regions 23 is positively related to a curvature of the bent portion 2. A region of the bent portion 2 with a larger curvature has a higher degree of bending. Denser arrangement of the closed regions 23 may buffer a stress as far as possible. A region of the bent portion 2 with a smaller curvature has a lower degree of bending. Relatively sparse arrangement of the closed regions 23 may effectively enhance an ability of the conductive wire group 22 to conduct current.

Furthermore, in the case where the overall width of the conductive wire group 22 is same, by comparing densely arranged regions with sparsely arranged regions among the closed regions 23, a width of each conductive wire in the densely arranged regions is usually smaller than that in the sparsely arranged regions, affecting the conductivity of the conductive wire group in the densely arranged regions.

Therefore, in an example of the present disclosure, a cross-sectional area of a conductive wire is positively related to the density of the closed regions. The density of the closed regions represents the number of closed regions per unit length of conductive wire. In this disclosure, a conductive wire will have a certain wire resistance due to its own material, metal structure, etc., and the wire resistance $R=\rho*L/S$, where $\rho$ is a resistivity, L is a length of the conductive wire, and S is a cross-sectional area of the conductive wire. When the cross-sectional area S of the conductive wire increases, the wire resistance of the conductive wire decreases accordingly, thereby reducing the resistance of the closed regions 23 in the conductive wire group 22, and ensuring the ability of the conductive wire group 22 to conduct current.

Figure 6:
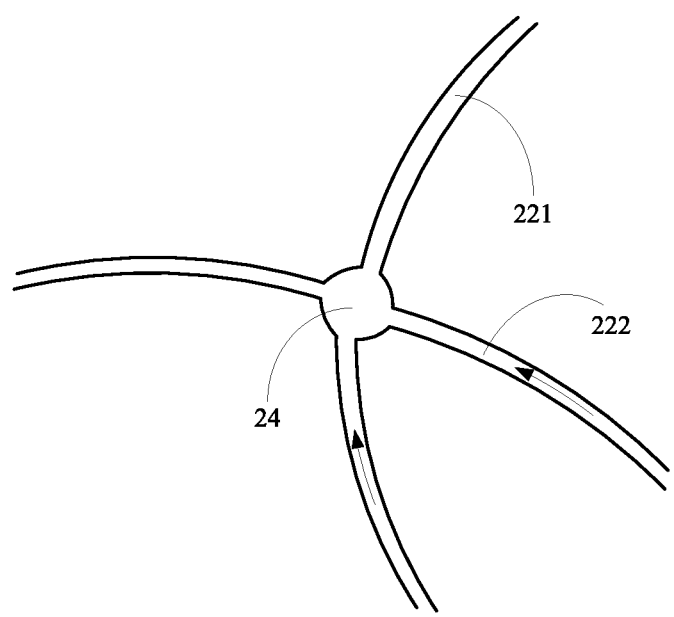
FIG. 6 is a schematic partial diagram illustrating a conductive wire group according to an example of the present disclosure.

In an example, the plurality of conductive wires in a curved shape are located on a same layer of the flexible display panel 100, and crossed conductive wires may share a cross region, thereby reducing the thickness of the flexible display panel 100. In FIG. 6, each conductive wire may be used to conduct current. Since each conductive wire crosses with another conductive wire, their cross region needs to conduct a sum of currents from the two crossed conductive wires. For example, assuming that a current conducted by the first conductive wire 221 is 2 mA and a current conducted by the second conductive wire 222 is 1 mA, each cross region 24 of the first conductive wire 221 and the second conductive wire 222 needs to conduct a current of 3 mA.

In this disclosure, in order to avoid breakage due to overload of a stress on a local region of the conductive wire group 22, a width of each conductive wire in a cross region is larger than that in other regions. For example, in FIG. 6, widths of the first conductive wire 221 and the second conductive wire 222 in the cross region 24 are larger than the first conductive wire 221 and the second conductive wire 222 in other regions, which enhances an ability of the cross region 24 to conduct current, and reduces a risk of overload of a stress on the conductive wire group 22.

Figure 7:
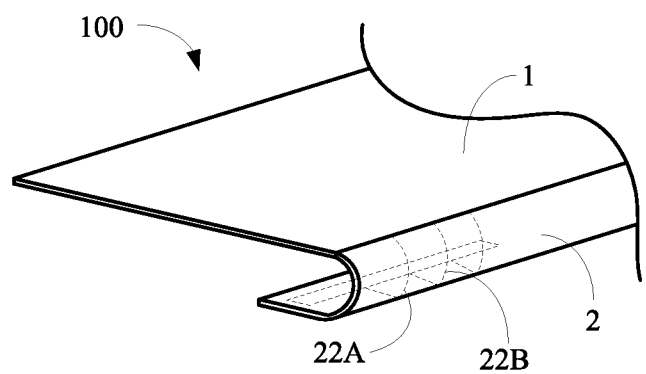
FIG. 7 is a schematic structural diagram illustrating another flexible display panel according to an example of the present disclosure, in which the bent portion may include a first conductive wire sub-group and a second conductive wire sub-group separated from each other.

Based on the technical solution of the present disclosure, as shown in FIG. 7, the conductive wire group 22 may include a plurality of conductive wire sub-groups separated from each other, and the plurality of conductive wire sub-groups may be configured to transmit a same electrical signal, or the plurality of conductive wire sub-groups may be configured to transmit at least two different electrical signals. For example, still as shown in FIG. 7, the bent portion 2 may include a first conductive wire sub-group 22A and a second conductive wire sub-group 22B separated from each other. The first conductive wire sub-group 22A and the second conductive wire sub-group 22B may be configured for electrical connection with a thin film transistor included in the flat portion 1 to control the pixel structure to be extinguished and lighted. Both of the first conductive wire sub-group 22A and the second conductive wire sub-group 22B may be used as gate lines to conduct gate signals. Alternatively, both of the first conductive wire sub-group 22A and the second conductive wire sub-group 22B may be used as data lines to conduct drive signals. Alternatively, the first conductive wire sub-group 22A is used as a gate line, and the second conductive wire sub-group 22B is used as a data line.

In the present disclosure, the first conductive wire sub-group 22A and the second conductive wire sub-group 22B are taken as an example for description. Although in some other examples, the conductive wire group 22 may further include three or more conductive wire sub-groups, gating signals and driving signals may exist at the same time in the conductive wire group, and the specific ratio may be designed as needed, which is not limited in this disclosure.

Figure 8:
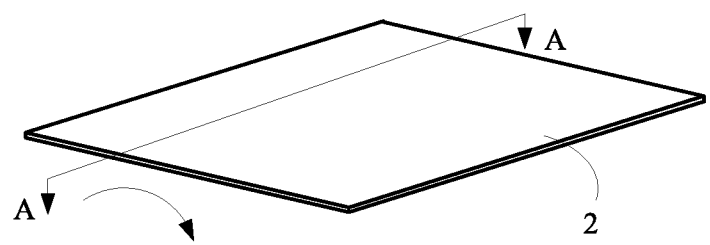
FIG. 8 is a state diagram illustrating a bent portion before bending according to an example of the present disclosure.
Figure 9:
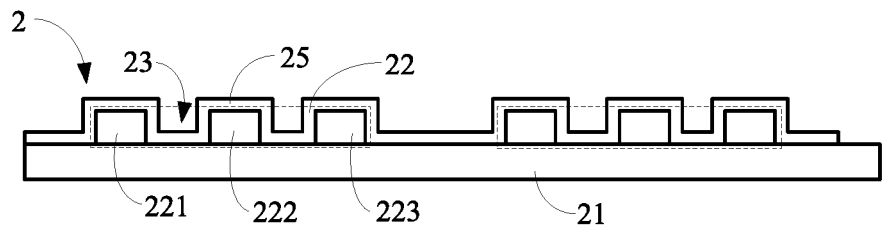
FIG. 9 is a cross-sectional diagram illustrating the bent portion in FIG. 8 along an A-A direction.

In this example, as shown in FIGS. 8 and 9, the bent portion 2 may further include an organic coating 25. The conductive wire group 22 may be located between the organic coating 25 and the substrate layer group 21. A part of the organic coating 25 may fall into the closed region 23 so that it is insulated through the organic coating 25. In addition, by adjusting the thickness of the organic coating 25, a position of a neutral layer generated when the bent portion 2 is bending may be adjusted to a layer where the conductive wire group 22 is located, to reduce the risk of breakage occurring in the conductive wire group 22. In an example of the present disclosure, as shown in a cross-sectional diagram of the bent portion along an A-A direction in FIG. 9, the bent portion 2 includes a plurality of layers. In the process of the bent portion changing from a flat state shown in FIG. 8 to a bending state shown in FIG. 9, layers in the bent portion will be bent in different degrees. Some layers will be stretched (called elongated layers). Some layers will be compressed (called shortened layers). Some layers will be neither stretched nor compressed (called neutral layers). The neutral layers in the present disclosure refer to layers that are neither elongated nor shortened at boundaries between the elongated layers and the shortened layers when the bent portion 2 is bending.

The organic coating may be made of a polyimide (PI) polymer, a polycarbonate (PC) resin (also known as PC plastic), polyethylene terephthalate (PET) plastic, or other materials. The substrate layer group 21 may include a layer structure such as a flexible substrate and an inorganic layer. The flexible substrate may be made of a flexible material. The flexible material may be made of a polyimide (PI) polymer, a polycarbonate (PC) resin (also known as PC plastic), polyethylene terephthalate (PET) plastic, or other materials. Materials of the inorganic layer 3 may be selected, for example, from a combination of one or more of aluminum oxide, zinc oxide, titanium oxide, silicon dioxide, silicon nitride, and zirconium oxide.

In above examples of the present disclosure, the conductive wire group 22 that is located in the bent portion 2 is taken as an example for detailed description. In some other examples, when the flat portion 1 has a bending ability or is configured to include a bendable structure (such bending ability or bendable structure is equivalent to the bent portion described above in the present disclosure), a conductive layer included in such flat portion may also be configured as the conductive wire group 22 in this disclosure.

An example of the present disclosure further provides a display device. The display device includes the flexible display panel as described in any of the examples of FIGS. 1-9. The display device may be a liquid crystal display device, electronic paper, a mobile phone, a tablet computer, a television, a display, a notebook computer, a digital photo frame, a navigator, or any product or component with a display function.

Those skilled in the art may understand that the drawings are only schematic diagrams of examples, and modules or processes in the drawings are not necessarily required to implement the present disclosure. The above is only the specific implementation of this disclosure, but the protection scope of this disclosure is not limited thereto. Any person skilled in the art can readily envisage that changes or replacements made within the technical scope disclosed in this disclosure shall be covered within the protection scope of this disclosure. Therefore, the protection scope of the present disclosure shall be based on the protection scope of the claims.

The invention claimed is:

1. A flexible display panel, comprising a bent portion, wherein the bent portion comprises:
   a substrate layer group; and
   a conductive wire group, wherein the conductive wire group is located on the substrate layer group, the conductive wire group comprises a plurality of conductive wires each having a curved shape, at least two of the plurality of conductive wires cross and surround at least one closed region, the at least one closed region is provided corresponding to at least a bent region of the bent portion,
   wherein a density of the at least one closed region is positively related to a curvature of the bent portion.

2. The flexible display panel according to claim 1, wherein the plurality of conductive wires have a same length direction, and the plurality of conductive wires are arranged in a wave shape along the length direction.

3. The flexible display panel according to claim 2, wherein the conductive wire group comprises at least three conductive wires, and each of the at least three conductive wires crosses with another conductive wire to form a plurality of closed regions side by side.

4. The flexible display panel according to claim 3, wherein two adjacent rows of closed regions are arranged in a staggered manner in a side-by-side direction of the plurality of closed regions.

5. The flexible display panel according to claim 1, wherein the plurality of conductive wires are located on a same layer of the flexible display panel, and crossed conductive wires share a cross region.

6. The flexible display panel according to claim 5, wherein a width of each of the plurality of conductive wires in the cross region is larger than a width of each of the plurality of conductive wires in another region.

7. The flexible display panel according to claim 1, wherein the conductive wire group comprises a plurality of conductive wire sub-groups separated from each other, and the plurality of conductive wire sub-groups are configured to transmit a same electrical signal.

8. The flexible display panel according to claim 1, wherein the conductive wire group comprises a plurality of conductive wire sub-groups separated from each other, and the plurality of conductive wire sub-groups are configured to transmit at least two different electrical signals.

9. The flexible display panel according to claim 1, wherein the density of the at least one closed region is further positively related to a cross-sectional area of each of the plurality of conductive wires.

10. The flexible display panel according to claim 1, wherein a ratio of a maximum width of the at least one closed region to a width of the plurality of conductive wires is in a range of 1/2-2.

11. The flexible display panel according to claim 1, wherein the bent portion further comprises an organic coating, the conductive wire group is located between the substrate layer group and the organic coating, and a part of the organic coating is located in the at least one closed region.

12. The flexible display panel according to claim 11, wherein a thickness of the organic coating is set so that the conductive wire group is located at a position of a neutral layer generated when the bent portion is bent.

13. The flexible display panel according to claim 11, wherein the organic coating is made of at least one material of a polyimide (PI) polymer, a polycarbonate (PC) resin, or polyethylene terephthalate (PET).

14. The flexible display panel according to claim 1, wherein the flexible display panel further comprises a flat portion, the flat portion is connected with the bent portion, the bent portion is bent from a connection between the flat portion and the bent portion, and the bent portion extends parallel to the flat portion.

15. The flexible display panel according to claim 1, wherein the flexible display panel further comprises a flat portion, and the bent portion is located adjacent to the flat portion.

16. The flexible display panel according to claim 1, wherein a length direction of the conductive wire group is perpendicular to a bending axis of the bent portion.

17. The flexible display panel according to claim 1, wherein a length direction of the conductive wire group is parallel to the bending axis of the bent portion.

18. A display device, comprising a flexible display panel according to claim 1.

* * * * *